US005830527A

United States Patent [19]
Vickers

[11] Patent Number: 5,830,527
[45] Date of Patent: Nov. 3, 1998

[54] FLAT PANEL DISPLAY ANODE STRUCTURE AND METHOD OF MAKING

[75] Inventor: Kenneth G. Vickers, Whitesboro, Tex.

[73] Assignee: Texas Instruments Incorporated, Dallas, Tex.

[21] Appl. No.: 654,653

[22] Filed: May 29, 1996

[51] Int. Cl.$^6$ .............................. C23C 14/00; B05D 5/06

[52] U.S. Cl. ..................... 427/64; 156/643.1; 156/656.1; 216/61; 204/192.32; 204/192.34; 204/192.35; 204/192.26; 427/157; 427/226; 427/250; 427/535

[58] Field of Search .............................. 427/64, 157, 250, 427/226, 535; 204/486, 490, 491, 192.32, 192.34, 192.35, 192.26; 156/643.1, 656.1; 216/67

[56] References Cited

U.S. PATENT DOCUMENTS

| | | | |
|---|---|---|---|
| 3,755,704 | 8/1973 | Spindt et al. | 313/309 |
| 4,857,799 | 8/1989 | Spindt et al. | 313/495 |
| 4,940,916 | 7/1990 | Borel et al. | 313/306 |
| 5,194,780 | 3/1993 | Meyer | 315/169.3 |
| 5,225,820 | 7/1993 | Clerc | 340/752 |
| 5,531,880 | 7/1996 | Xie et al. | 204/491 |
| 5,536,383 | 7/1996 | Van Danh et al. | 204/490 |

*Primary Examiner*—Janyce Bell
*Attorney, Agent, or Firm*—Rose Alyssa Keagy; Richard L. Donaldson

[57] ABSTRACT

In accordance with the principles of the present invention, there is disclosed herein a structure and method of fabricating an anode plate for use in a field emission device. The method comprises the steps of providing a transparent substrate 20 and applying transparent insulative material 28 over the substrate 20. Next, particles of luminescent material 25 are partially embedded in selective areas of the transparent insulative material 28. A layer of electrically conductive material 23 is then applied over the luminescent material 25. The layer of electrically conductive material 23 is abraded so as to remove portions of the layer of electrically conductive material 23 and portions of at least some of the luminescent particles 25.

38 Claims, 5 Drawing Sheets

FLAT PANEL DISPLAY ANODE STRUCTURE AND METHOD OF MAKING

RELATED APPLICATION

This application includes subject matter which is related to U.S. patent application Ser. No. 08/603,364, now U.S. Pat. No. 5,778,887, "Method for Improving Flat Panel Display Anode plate Phosphor Efficiency," (Texas Instruments, Docket No. TI-21091), filed Feb. 20, 1996.

TECHNICAL FIELD OF THE INVENTION

The present invention relates generally to flat panel displays and, more particularly, a method for improving the phosphor efficiency of the anode plate of the field emission display.

BACKGROUND OF THE INVENTION

Advances in Field emission display technology are disclosed in U.S. Pat. No. 3,755,704, "Field Emission Cathode Structures and Devices Utilizing Such Structures," issued 28 Aug. 1973, to C. A. Spindt et al.; U.S. Pat. No. 4,857,799, "Matrix-Addressed Flat Panel Display," issued 15 Aug. 1989, to C. A. Spindt et al.; U.S. Pat. No. 4,940,916, "Electron Source with Micropoint Emissive Cathodes and Display Means by Cathodoluminescence Excited by Field Emission Using Said Source," issued 10 Jul. 1990 to Michel Borel et al.; U.S. Pat. No. 5,194,780, "Electron Source with Microtip Emissive Cathodes," issued 16 Mar. 1993 to Robert Meyer; and U.S. Pat. No. 5,225,820, "Microtip Trichromatic Fluorescent Screen," issued 6 Jul. 1993, to Jean-Frédéric Clerc. These patents are incorporated by reference into the present application.

The Clerc ('820) patent discloses a trichromatic field emission flat panel display having a first substrate, on which are arranged a matrix of conductors. The first substrate is also called the cathode plate or the emitter plate. In one direction of the matrix, conductive columns comprising the cathode electrode support the microtips. In the other direction, above the column conductors, are perforated conductive rows comprising the grid electrode. The row and column conductors are separated by an insulating layer having apertures permitting the passage of the microtips, each intersection of a row and column corresponding to a pixel.

On a second substrate, facing the first, the display has regularly spaced, parallel conductive stripes comprising the anode electrode. The second substrate is also called the anode plate. These stripes are alternately covered by a first material luminescing in the red, a second material luminescing in the green, and a third material luminescing in the blue, the conductive stripes covered by the same luminescent material being electrically interconnected.

The Clerc patent discloses a process for addressing a trichromatic field emission flat panel display. The process consists of successively raising each set of interconnected anode stripes periodically to a first potential which is sufficient to attract the electrons emitted by the microtips of the cathode conductors corresponding to the pixels which are to be illuminated in the color of the selected anode stripes. Those anode stripes which are not being selected are set to a potential such that the electrons emitted by the microtips are repelled or have an energy level below the threshold cathodoluminescence energy level of the luminescent materials covering those unselected anodes.

Luminescence is a characteristic nonthermal emission of electromagnetic radiation by a material upon some form of excitation. Thus, luminescence is the conversion of energy into light without heat. The luminescence type is usually defined by the excitation means. For example, cathodoluminance is where the source of energy is cathode rays. The luminescence process itself involves (1) the absorption of energy; (2) excitation; and (3) the emission of energy, usually in the form of radiation in the visible portion of the spectrum; however, the emission can also be in the infrared or ultraviolet portions of the spectrum. Visible light constitutes one part of the electromagnetic spectrum (approximately 4,000 Å–8,000 Å).

When the luminance persists after the excitation is removed it is called phosphorescence. Quantitatively, phosphorescence may be defined as luminescence that is delayed by more than $10^{-8}$ seconds after excitation. An inorganic luminescent material, such as phosphor, usually consists of a crystalline host lattice to which is added a trace of impurities, called the activator and co-activator. The activator is usually present in concentration levels varying from a few parts per million to one or two percent of the host lattice. Co-activators are the additional impurities which act as charge compensators or donors in the lattice.

Referring initially to FIG. 1, there is shown, in cross-sectional view, a portion of an illustrative prior art field emission device. This device comprises an anode plate 1 having a cathodoluminescent phosphor coating 3 facing an emitter plate 2, the phosphor coating 3 being observed from the side opposite to its excitation.

More specifically, the field emission device of FIG. 1 comprises an anode plate 1 and an electron emitter (or cathode) plate 2. A cathode portion of emitter plate 2 includes conductors 9 formed on an insulating substrate 10, an electrically resistive layer 8 which is formed on substrate 10 and overlaying the conductors 9, and a multiplicity of electrically conductive microtips 5 formed on the resistive layer 8. In this example, the conductors 9 comprise a mesh structure, and microtip emitters 5 are configured as a matrix within the mesh spacings. Microtips 5 take the shape of cones which are formed within apertures through conductive layer 6 and insulating layer 7.

A gate electrode comprises the layer of the electrically conductive material 6 which is deposited on the insulating layer 7. The thicknesses of gate electrode layer 6 and insulating layer 7 are chosen in such a way that the apex of each microtip 5 is substantially level with the electrically conductive gate electrode layer 6. Conductive layer 6 may be in the form of a continuous layer across the surface of substrate 10; alternatively, it may comprise conductive bands across the surface of substrate 10.

Anode plate 1 comprises a transparent, electrically conductive film 12 deposited on a transparent planar support 13, such as glass, which is positioned facing gate electrode 6 and parallel thereto, the conductive film 12 being deposited on the surface of the glass support 13 directly facing gate electrode 6. Conductive film 12 may be in the form of a continuous layer across the surface of the glass support 13; alternatively, it may be in the form of electrically isolated stripes comprising three series of parallel conductive bands across the surface of the glass support 13, as shown in FIG. 1 and as taught in U.S. Pat. No. 5,225,820, to Clerc. By way of example, a suitable material for use as conductive film 12 may be indium-tin-oxide (ITO), which is substantially optically transparent and electrically conductive. Anode plate 1 also comprises a cathodoluminescent phosphor coating 3, deposited over conductive film 12 so as to be directly facing and immediately adjacent gate electrode 6. In the Clerc patent, the conductive bands of each series are covered with a particulate phosphor coating which luminesces in one of the three primary colors, red, blue and green $3_R$, $3_B$, $3_G$.

Selected groupings of microtip emitters 5 of the above-described structure are energized by applying a negative potential to cathode electrode 9 relative to the gate electrode 6, via voltage supply 15, thereby inducing an electric field which draws electrons from the apexes of microtips 5. The potential between cathode electrode 9 and gate electrode 6 is approximately 70–100 volts. The emitted electrons are accelerated toward the anode plate 1 which is positively biased by the application of a substantially larger positive voltage from voltage supply 11 coupled between the cathode electrode 9 and conductive film 12 functioning as the anode electrode. The potential between cathode electrode 9 and anode electrode 12 is approximately 300–1000 volts. Energy from the electrons attracted to the anode conductive film 12 is transferred to particles of the phosphor coating 3, resulting in luminescence. The electron charge is transferred from phosphor coating 3 to conductive film 12, completing the electrical circuit to voltage supply 11. Charge can also be transferred by secondary electron emission. The image created by the phosphor stripes is observed from the anode side which is opposite to the phosphor excitation, as indicated in FIG. 1.

The process of producing each frame of a display using a typical trichromatic field emission display includes (1) applying an accelerating potential to the red anode stripes while sequentially addressing the gate electrodes (row lines) with the corresponding red video data for that frame applied to the cathode electrodes (column lines); (2) switching the accelerating potential to the green anode stripes while sequentially addressing the rows lines for a second time with the corresponding green video data for that frame applied to the column lines; and (3) switching the accelerating potential to the blue anode stripes while sequentially addressing the row lines for a third time with the corresponding blue video data for that frame applied to the column lines. This process is repeated for each display frame.

It is to be noted and understood that true scaling information is not intended to be conveyed by the relative sizes and positioning of the elements of anode plate 1 and the elements of emitter plate 2 as depicted in FIG. 1. For example, in a typical FED shown in FIG. 1 there are approximately one hundred arrays 4, of microtips per display pixel, and there are three color stripes $3_R$, $3_B$, $3_G$ per display pixel. Furthermore, phosphor coating 3 may not be a dense coating, but instead be comprised of an arrangement of phosphor particles which have adhered to conductors 12.

The typical phosphor synthesis process creates a non-active surface layer (often called a "dead voltage layer") on the phosphor particles. This inactive surface layer, also referred to as 'skin' herein, contributes significantly to phosphor inefficiency. It is well known that the penetration depth of an electron into a phosphor particle is related to the kinetic energy of the electron. The penetration depth (called the mean-free path) of the electrons in the typical FED application is approximately 100 Å. Since thickness of the phosphor coating can be greater than 100 Å, a significant number of the electrons will recombine nonradiatively in the surface layer and will not produce luminance from the phosphor. The occurrence of nonradiative recombinations contributes to phosphor inefficiency and therefore adversely impacts display brightness and quality. The inactive surface region of the phosphor has a greater adverse effect in FED applications than in Cathode Ray Tube (CRT) applications because CRT's typically operate at a much higher voltage (25–30 kilovolts) and therefore the mean-free path is much greater and the phosphor efficiency is higher in CRT applications.

Luminous efficiency is defined as the ratio of the total luminous flux in lumens emitted by a light source over all wavelengths to the total incident energy in watts (current× volts). The value for lumens is adjusted to take into account the efficiency of the human eye.

It is well known that most of the commonly used flat panel display phosphors have a lower luminance efficiency at the acceleration voltage levels of the typical field emission device (below 1 kV) compared to other systems such as the Cathode Ray Tube (CRT) (25–30 kV). It is advantageous to operate the field emission device at the lower voltages because the low voltage operation simplifies spacer technology, reduces driver and interconnect cost, reduces display mortality caused by high voltage arcing, and allows the use of the switched anode design. Therefore, one shortcoming of field emission displays of the current technology is the reduced phosphor efficiency caused by the relatively low accelerating voltage between the cathode and anode plates. An improved luminance efficiency would facilitate improved display luminance and reduced power consumption.

Another shortcoming of field emission displays is the reduced phosphor efficiency caused by the presence of the conductive ITO layer located between the phosphors and the viewer's eye. The ITO layer can act as a reflector, thereby inhibiting the free flow of luminance between the energized phosphors and the viewer's eye.

In view of the above, it is clear that there exists a need for improved phosphor efficiency for field emission devices. More specifically, what is needed is an improvement in the structure and method of manufacturing the anode plate of a field emission flat panel display device which facilitates improved phosphor efficiency and higher luminance.

SUMMARY OF THE INVENTION

In accordance with the principles of the present invention, there is disclosed herein a structure and method of fabricating an anode plate for use in a field emission device. The method comprises the steps of providing a transparent substrate and applying transparent insulative material over the substrate. Next, particles of luminescent material are partially embedded in selective areas of the transparent insulative material. A layer of electrically conductive material is then applied over the luminescent material. The layer of electrically conductive material is abraded so as to remove portions of the layer of electrically conductive material and portions of at least some of the luminescent particles.

The methods disclosed herein for embedding phosphors into a transparent material, applying the conductive material, and then removing portions of the conductive material and the inactive surface region of the phosphor particles overcome limitations and disadvantages of the prior art display devices and methods. Phosphor particles are generally non-conductive and therefor receive and store the charge created by the bombardment of the phosphor by the electrons emitted from the microtips. The resulting build-up of negative charge by the phosphor soon acts to repel subsequent incoming emitted electrons. This charge build-up lowers the phosphor's luminescent efficiency and thereby causes the display to dim. The addition of the conductive material greatly increases the lateral conductive path between phosphor particles, thereby allowing the phosphor particles to dissipate their electrical charge easily. The advantageous result is that the phosphors can quickly receive newly emitted electrons. The electrons released by the phosphors into the conductive material do not re-enter surrounding phosphors because the electrons are more attracted to the conductive material in the spaces between the phosphors than to the generally non-conductive phosphors. In summary the improved dissipation of charge results in a greatly enhanced luminescent efficiency.

Another advantage is that the light emitted from the phosphor particles are not impeded by the conductive ITO layer. The charge drains from the phosphors laterally into the conductive material, yet the anode stripe conductors and the conductive material in between the phosphor particles do not block the light emitted by the phosphors from traveling to the viewer's eye. In addition, the layer of conductive material lying between the phosphor particles acts as a back reflection surface to redirect to the viewer's eye the photons which are deflected off the of SOG/glass interface.

Removing the conductive material and the inactive surface region of the phosphors at the surface of the arrangement will allow more electrons emitted from the microtips of the cathode plate to penetrate to the active region of the phosphor particles; thereby transferring more energy to excite luminescence. Thus, removal of the conductive material and the particle surface will reduce the loss of incident electrons in the conductive surface region of the phosphor particle which causes a reduced luminescence efficiency.

The result of the manufacturing process described above is a higher efficiency FED display than prior art displays at a low operating voltage. Furthermore, by reducing the operating voltage required to realize the desired luminance level, less power is consumed. Since the advantageously described processes for embedding the phosphors into a transparent material, depositing the conductive material between the phosphor particles, and removing selected conductive material and phosphor surfaces are well understood, all of the above advantages are realized without the time and expense of developing a new enabling technology.

BRIEF DESCRIPTION OF THE DRAWINGS

The foregoing features of the present invention may be more fully understood from the following detailed description, read in conjunction with the accompanying drawings, wherein.

DESCRIPTION OF THE PREFERRED EMBODIMENT

Figure 1:
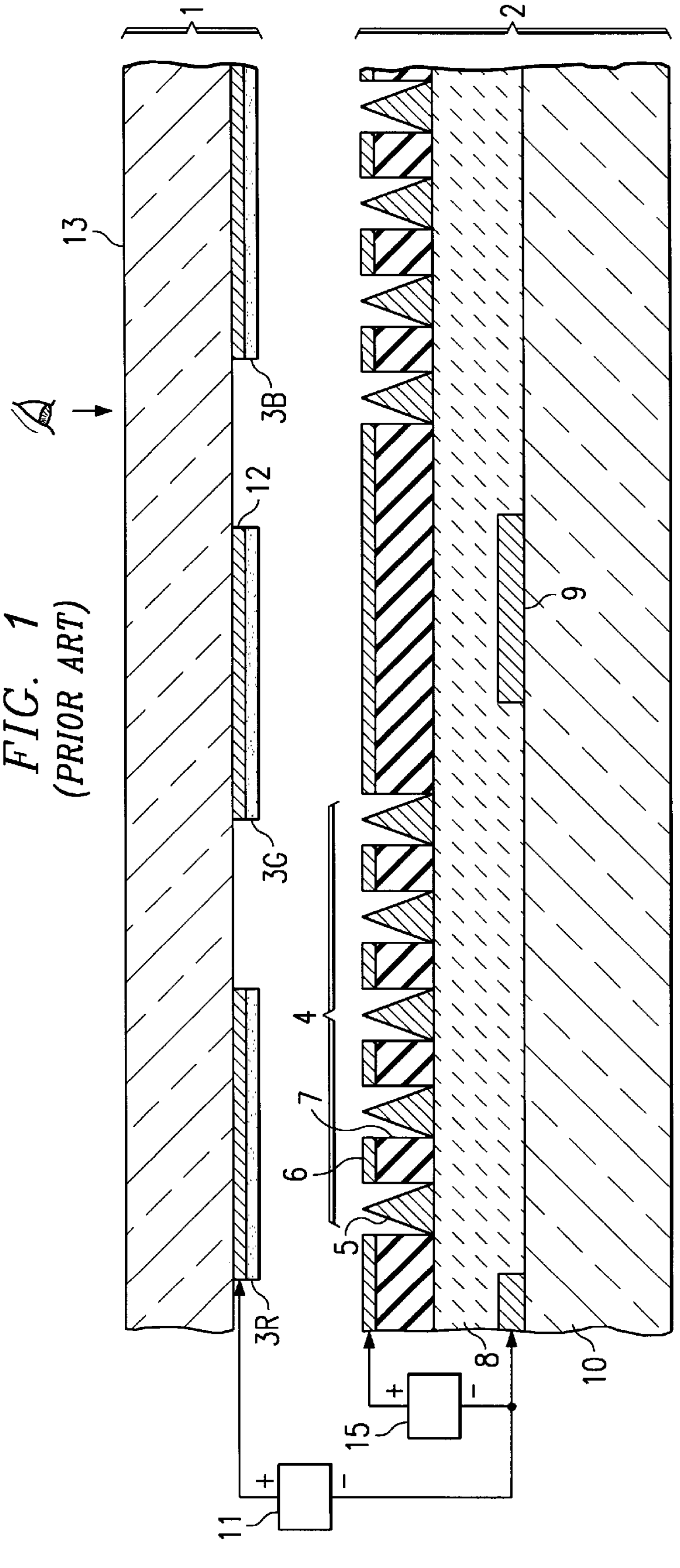
FIG. 1 (PRIOR ART)
FIG. 1 illustrates in cross section a portion of a field emission flat panel display device according to the prior art.
Figure 2:
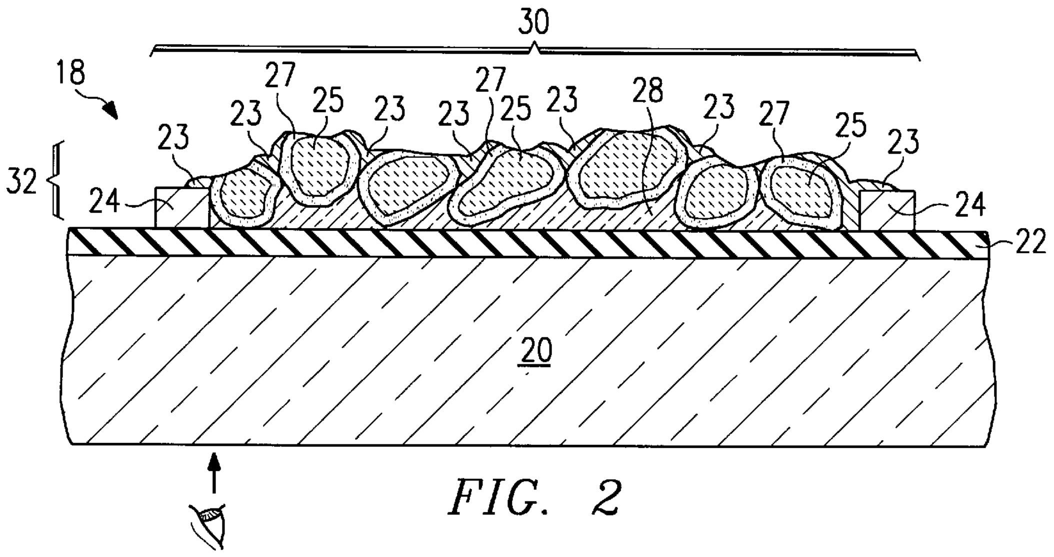
FIG. 2 is a cross-sectional view of an anode stripe region of the anode plate in accordance with a first embodiment of the present invention.

Referring now to FIG. 2, there is shown a cross-sectional view of an anode plate in accordance with one embodiment of the present invention. Anode plate 18, shown inverted from the position of anode plate 1 of FIG. 1, comprises a transparent planar substrate 20, illustratively glass, having a layer 22 of an insulating material, illustratively silicon dioxide ($SiO_2$). A plurality of parallel conductive regions 24, referred to as anode stripes, are patterned on insulating layer 22. Each pair 24, of conductive regions are electrically coupled and define the outside boundaries of an anode stripe 30 of one color (illustratively red, green or blue). A suitable material for use as anode stripe conductors 24, may be aluminum (Al). However, anode stripe conductors 24 may be other conductive materials, such as indium-tin-oxide (ITO), which is optically transparent and electrically conductive. Two conductive regions 24 and the arrangement of phosphors 25 comprise one anode electrode 30 of the field emission flat panel display device of the present invention and extend normal to the plane of the drawing sheet.

Substantially transparent insulative material 28 is located in between two conductive regions 24. Illustratively, the transparent material is Spin On Glass (SOG). Luminescent material 32 is embedded at least partially in material 28. Luminescent material 32 comprises an arrangement of phosphor particles 25, which together luminesce in one of the three primary colors; red, green, and blue. A preferred process for embedding phosphor layer 32 in transparent insulative material 28 is described below. An electrically conductive material 23, illustratively aluminum, is formed in the spaces between the phosphor particles 25. The skin 27 of the phosphor particles 25, and most of the conductive material 23, facing the microtips 5 of the emitter plate 2 (shown in FIG. 1) is removed using one of a variety of techniques described more fully below.

For purposes of this disclosure, as well as the claims which follow, the term "transparent" shall refer to a high degree of optical transmissivity in the visible range (the region of the electromagnetic spectrum approximately between 4,000–8,000 Å). Also for purposes of this disclosure, the term transparent includes substantially transparent.

No true scaling information is intended to be conveyed by the relative sizes of the elements of FIG. 2. By way of illustration, stripe conductors 24 may be $2\mu$ in width, the total width of an anode stripe 30 may be $70\mu$, and the anode stripes 30 may be spaced from one another by $30\mu$. The thickness of conductors 24 may be approximately 1,500 Å, and the thickness of the transparent insulative material 28 may be $10\mu$ thick. The phosphor layer 32 may be approximately 5–$10\mu$ thick. The substrate 20 is approximately 1.1 mm thick and the insulating layer 22 is approximately 500 Å thick.

Figure 3:
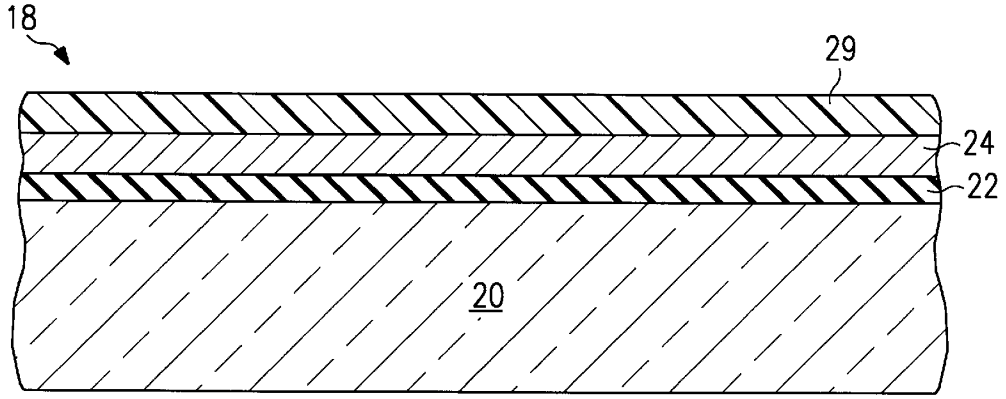
FIGS. 3, 4, 5, 6, 7, 8 and 9 illustrate steps in a process for fabricating the anode plate of FIG. 2 in accordance with the present invention.
Figure 4:
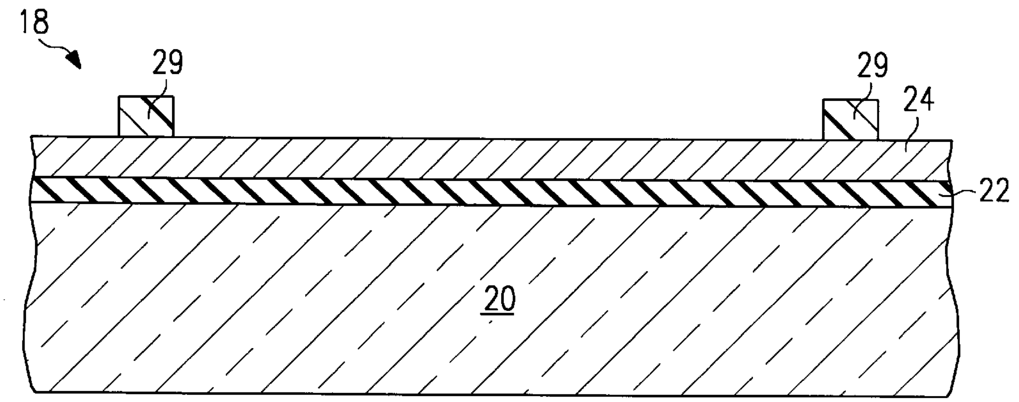
Figure 5:
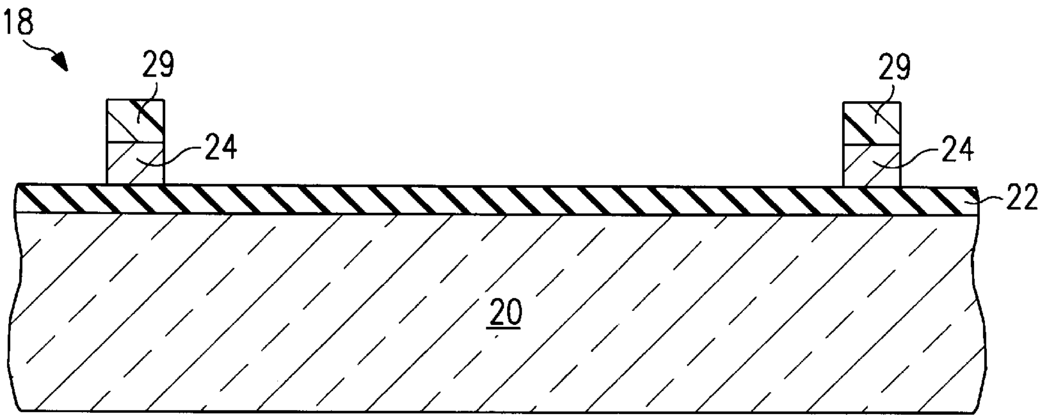

An illustrative method for manufacturing the anode plate 18 is as follows. Referring initially to FIG. 3, the glass substrate 20 is purchased with an $SiO_2$ insulating layer 22 which is 500 Å thick and a layer of aluminum or ITO 24 which is 1,500 Å thick. A layer of photoresist 29, illustratively type AZ-1350J sold by Hoescht-Celanese of Somerville, N.J., is spun on over the layer 24 to a thickness of approximately 10,000 Å. Next, a patterned mask (not shown) is disposed over the light-sensitive photoresist layer. The mask exposes the desired regions of the photoresist to light. The mask used in this step defines anode stripes 24 which have a width of approximately $2\mu$. The exposed regions are removed during the developing step, which may consist of soaking the assembly in a caustic or basic chemical such as Hoescht-Celanese AZ developer. The developer removes the unwanted photoresist regions which were exposed to light, as shown in FIG. 4. The exposed regions of the conductive layer 24 are then removed, typically by a reactive ion etch (RIE) process using carbon tetraflouride ($CF_4$) or a wet etch process using hydrochloric acid (HCl), leaving the structure shown in FIG. 5. Although not shown as part of this process, it may also be desired to remove $SiO_2$ layer 22 underlying the etched-away regions of the conductive layer 24.

Figure 6:
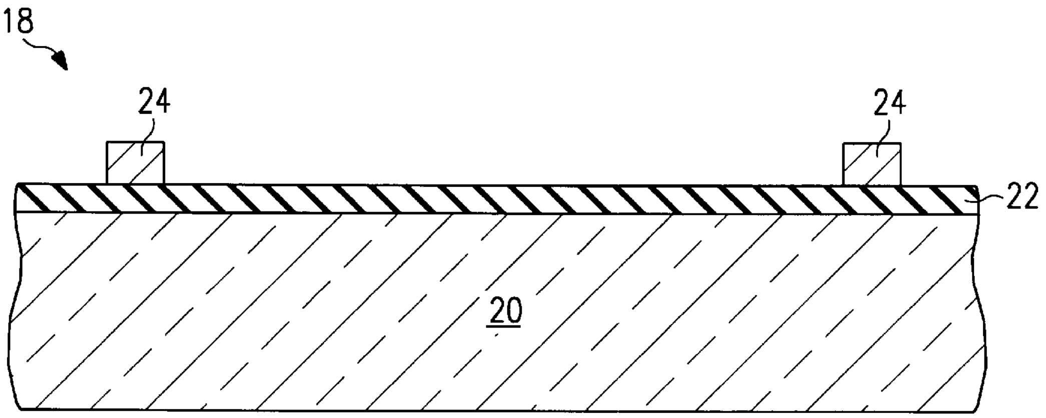

The remaining photoresist layer 29 is next removed by a wet strip process using commercial organic strippers or by plasma ashing, leaving the structure shown in FIG. 6. The portions of the conductive layer 24 which now remain on substrate 20 are conductive anode regions or stripes 24.

Figure 7:
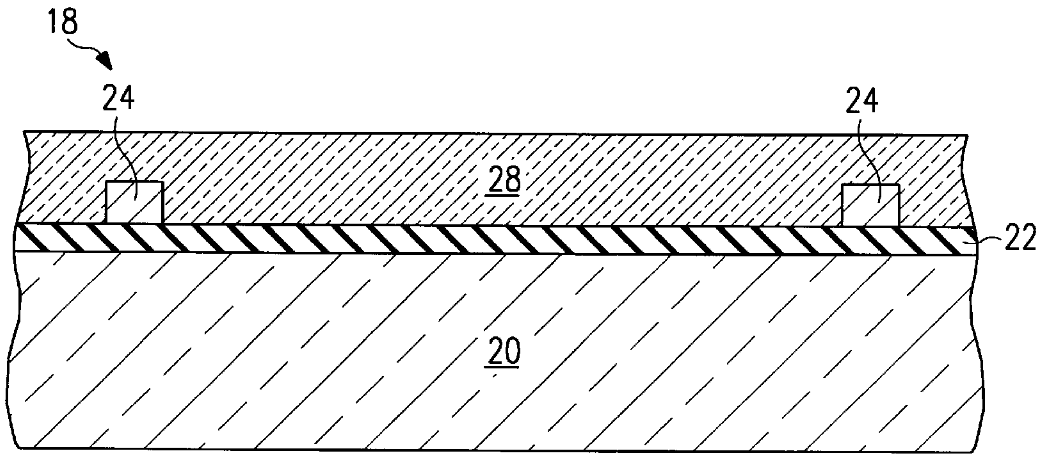

The next step in the manufacturing process is to apply substantially transparent insulative material 28 over the substrate. The insulative material 28 is illustratively Spin On Glass (SOG) with an average thickness of $10\mu$. Electrically insulating material 28 is preferably formed from a solution of tetraethylorthosilicate (TEOS), which is sold by, for example, Allied Signal Corp., of Morristown, N.J. The solution of TEOS, including a solvent which may comprise ethyl alcohol, acetone, N-butyl alcohol and water, is commonly referred to as Spin On Glass. The TEOS and solvents are combined in proportions according to the desired viscosity of the SOG solution. TEOS provides the advantages of curing at a relatively low temperature, and when fully cured, all of the solvent and most of the organic materials are driven out, leaving primarily glass ($SiO_x$). The TEOS solution may be spun on the surface of anode plate 18, or it may be spread on the surface, using techniques which are well known in the manufacture of displays such as liquid crystal devices (LCD's). The structure of anode plate 18 at this point of the manufacturing process is shown in FIG. 7. Once the SOG 28 has been applied, it is lightly cured by a hot plate bake for 60 seconds at 100°–200° C. The step of lightly curing the SOG makes the SOG advantageously pliable and adhesive, thereby facilitating the embedding of phosphor particles.

The substrate 18 is now prepared for the embedding of the phosphor particles of a first color, illustratively red phosphor particles. A layer of photoresist 29 is spun on over the anode plate 18 to a thickness of approximately 10,000 Å, as described above. A patterned mask is used to define the red stripes of the anode plate. The photoresist 29 in the red stripe regions is exposed to light and removed during the developing step, as described above.

Figure 8:
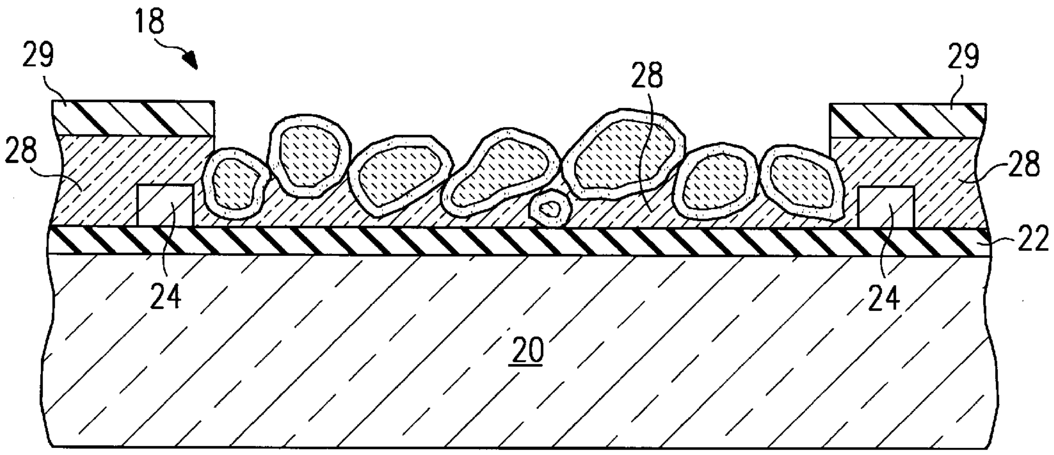

Particles of red luminescent material 25 are now embedded in the insulative material 28 in accordance with any one of a number of manufacturing methods well known in the art. For example, phosphor particles which together luminesce red may be embedded into the lightly cured SOG by dusting. Alternatively, the phosphor particles 25 may be embedded into the SOG 28 by spraying or silk screening. As explained earlier, the phosphor particles 25 will have skins 27 created during the phosphor synthesis process. The structure of anode plate 18 at this point in the manufacturing process is shown in FIG. 8. Next the remaining photoresist 29 is removed from anode plate 18.

The above steps of applying photoresist, applying a mask and developing the photoresist, embedding phosphor particles in the SOG, and then removing the remaining photoresist, is repeated for the blue anode stripes and then the green anode stripes. After all phosphor particle deposition has taken place the SOG is hard cured by a furnace bake for 60 minutes at 350°–450° C. Once the hard sure of the SOG has been completed, the phosphor particles 25 will be firmly embedded into the SOG 28.

Figure 9:
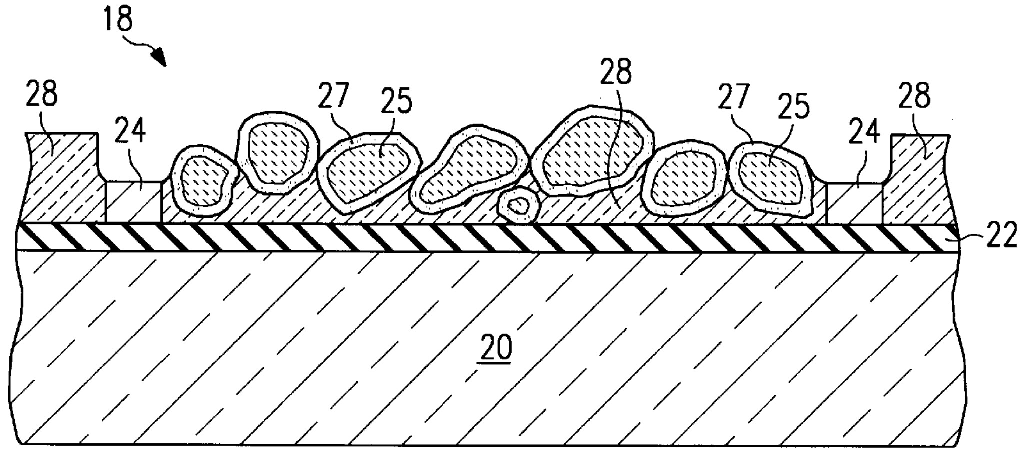

After the SOG has been hard cured the SOG will be etched to expose the stripe conductors 24 and the via connection between the stripe conductors 24 and the three color buses (not shown). Photoresist is again applied and patterned as described above to expose the SOG overlaying the anode stripe conductors 24 and the vias. The exposed SOG is then removed, illustratively, by plasma etching using $CF_4$. Then the remaining photoresist is removed. The structure of anode plate 18 at this point in the manufacturing process is shown in FIG. 9.

Figure 10:
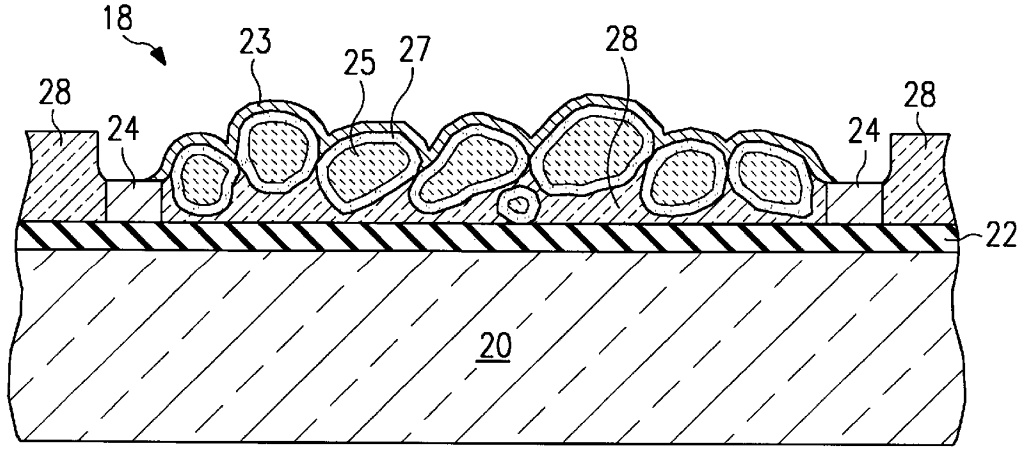
FIG. 10 is a cross-sectional view of an anode stripe region of the anode plate in accordance with a second embodiment of the present invention.

A layer of electrically conductive material 23, illustratively aluminum, is now deposited over the layer of phosphors, as shown in FIG. 10. For purposes of this disclosure, as well as the claims which follow, the term "layer" denotes a composition of material that may be continuous or may contain discontinuities. The deposition of the conductive material 23 may be accomplished in one of many ways. One method is a standard sputtering process using argon atoms and a vacuum of approximately $10^{-2}$ to $10^{-3}$ torr. A bias is applied which ionizes the argon atoms and accelerates them toward a sputter target of aluminum. As the argon atoms collide with the target of conductive material, particles of conductive material are removed from the target and travel toward the anode plate 18 and eventually builds a film of conductive material 23 over the phosphor layer 18. Illustratively, the conductive material 23 sputtered to a depth of approximately 500 Å. The use of the sputtering technique to deposit the conductive material 23 results in good penetration of aluminum between the phosphor particles 25 plus good sidewall coverage of the phosphor particles 25.

However, there are many other techniques which may be used to deposit the conductive material 23. Maximum penetration between phosphor particles may be obtained by depositing the conductive material 23 with the well known process of evaporation. Using 90° evaporation in a vacuum of approximately $10^{-6}$ torr, electrons may be ejected from the evaporation source gun toward a pot of desired conductive material. The collision of the electrons with the conductive material heats the material to its evaporation point, causing metal atoms to leave the pot and travel in a collision free path until they strike the anode plate held with the arrangement of phosphors 25 normal to the evaporative metal path. Again the conductive material is illustratively aluminum. However other conductive materials such as copper or gold may be used.

The 90° evaporation technique will result in a conductive film 23 which penetrates the crevices between the phosphor particles 25 better than the film 23 deposited by the sputter technique. But the film 23 deposited by sputtering will have better sidewall coverage than the film 23 created with evaporation at an angle 90° to the surface of anode plate 18. Furthermore, the aluminum may penetrate the crevices between the phosphor particles 25 better if the evaporation is performed with a slight wobble and rotation around the anode plate's axis normal to its surface.

Another method for obtaining good conductive material coverage of the sidewalls of the phosphor layer is by the use of the standard evaporation technique with a rotating shallow angle. The shallow evaporation angle will direct the aluminum particles toward the anode plate at an angle which allows the aluminum particles to more easily deposit on the sidewalls of the phosphor particles 25.

While it would increase manufacturing costs, a combination of more than one method could be advantageous. Still other standard techniques, such as Chemical Vapor Deposition (CVD), may be used to deposit conductive material 23. It may even be desirable to coat the phosphor particles 25 with the conductive material 23 before depositing the particles 25. However, the disadvantage of coating the phosphor particles 25 before depositing the particles onto the SOG layer 28 is that it results in an opaque layer of conductive material 23 which is in-between the phosphor particles 25 and the glass substrate 20. The conductive material located between the phosphor particles and the glass substrate 20 forms a light barrier which blocks the travel of light from the phosphor particles 25 to the viewer's eye.

In order to prevent electrical shorting between anode stripes 30, the conductive material 23 should be absent from the areas between the anode stripes 30. This can be accomplished in any one of a number of well known ways. For example, photoresist may be deposited between the anode stripes 30 before the conductive material 23 is deposited, Then after the conductive material 23 is deposited, the photoresist can be removed, thereby also removing the conductive material 23 formed on top of the photoresist. Alternatively, the conductive material 23 may be removed with standard etching techniques after the conductive material 23 has been deposited.

The next step in the manufacturing process of the anode plate 18 is to abrade, or remove, an outer portion of the inactive surface layer, or skin, 27 of the phosphor particles 25, as well as an outer portion of the conductive material 23, at the surface of phosphor particles 25 which face the cathode plate. The removal of the conductive material and the inactive surface layer 27 on the exposed outer particles 25 will increase phosphor efficiency by allowing the electrons emitted by the microtips of the cathode plate to more easily penetrate to the active centers of the phosphor particles.

The inactive surface layer 27 on the exposed outer surfaces of arranged phosphor particles 25 is removed by the well known technique of ion milling, as summarized below. Other methods, such as sputtering or ion etching, could also be used in replacement of (or in addition to) ion milling.

The ion milling process involves placing the anode plate in a vacuum and using an ion gun to direct an inert gas, illustratively argon, in a raster motion to the surface layer of the phosphor arrangement. The ion milling is preferably done at a grazing angle of approximately 30° while rotating the anode plate 18 around a normal axis. This technique will cause bombardment of the surface of the phosphor particles 25 at all angles without penetrating between the particles. Alternatively, the sputtering process involves placing the anode plate in a vacuum and directing a spray of inert gas, such as argon, to the anode plate.

In both processes, the physical impact of the argon ions hitting the surface of phosphor particles 25 transfers energy to the surface of the particles 25 removing the outer surface of conductive material 23 and the outer phosphor surface 27. The rate of material removal from the particles is illustratively 50 Å per minute. Therefore, to insure removal of the outer portions of conductive material 23 and coating 27, the ion milling process continues for approximately 5–10 minutes, removing sufficient material from the surface of the phosphor arrangement to expose the active phosphor compound. It is within the scope of this invention to change the duration of the milling process in order to remove more of less of the surface material from the phosphor arrangement. The resulting advantageous structure is shown in FIG. 2.

The final steps of the manufacturing process involve the creation of the anode plate buses using the double level metal techniques described in U.S. patent application Ser. No. 08/402,750, "Field Emission Display Having Modified Anode Stripe Geometry," filed Mar. 13, 1995 (Texas Instruments, Docket No. TI-19075), incorporated herein by reference.

Several other variations in the above processes, such as would be understood by one skilled in the art to which it pertains, are considered to be within the scope of the present invention. As a first such variation, it will be understood that a hard mask, such as aluminum or gold, may replace photoresist layer 29 of the above process. Also, while the disclosure describes a manufacturing process using positive photoresist, a manufacturing process employing negative photoresist is also comprehended.

The green phosphor particles are illustratively $Tb:Gd_2O_2S$, the red phosphor particles are illustratively $Y_2O_2S:Eu$, and the blue phosphor particles are illustratively ZnS:Ag. However, other phosphors may be used to create the red, green, and blue phosphor arrangements. Moreover the phosphor arrangement could be a phosphor film layer instead of an arrangement of phosphor particles. Furthermore, other gases such as neon or krypton may be used in the evaporation, ion milling, or sputtering processes.

Figure 11:
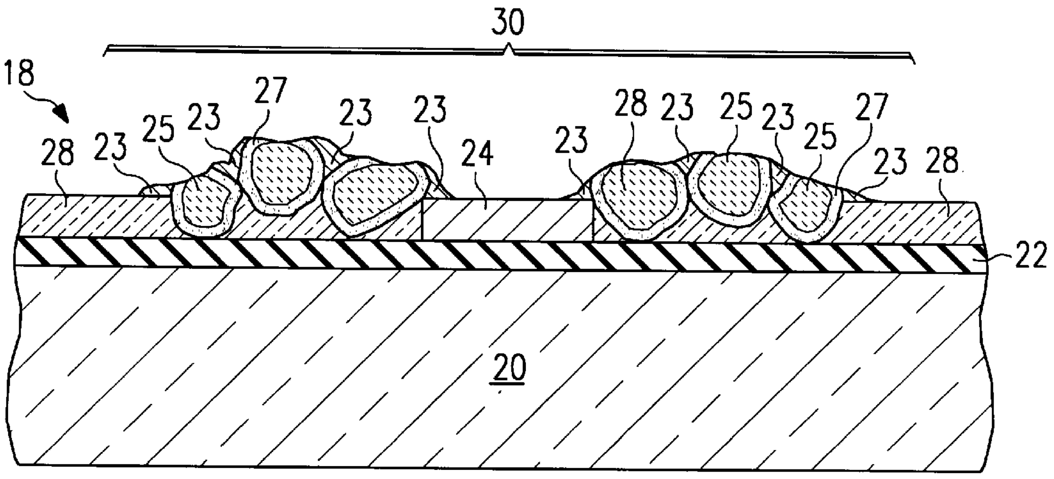
FIG. 11 is a cross-sectional view of an anode stripe region of the anode plate in accordance with a third embodiment of the present invention.
Figure 12:
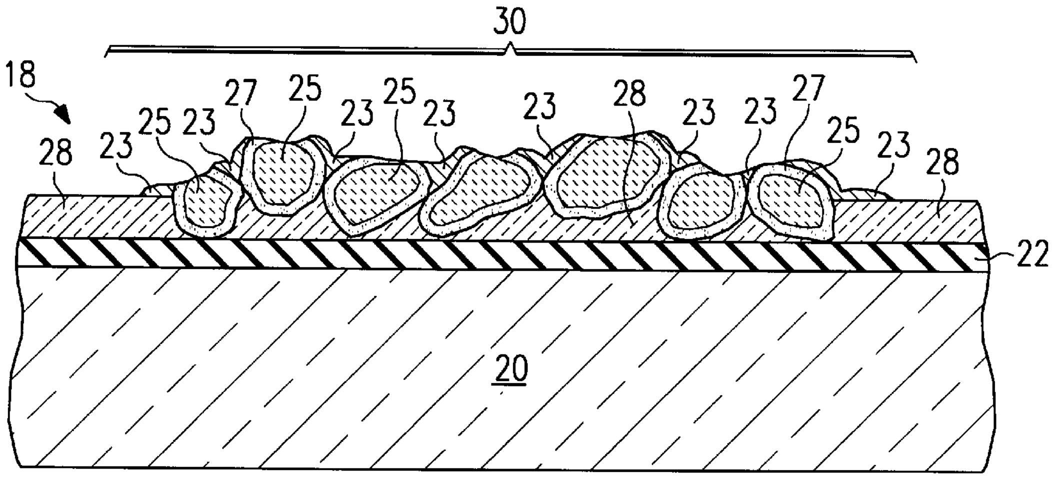
FIG. 12 is a cross-sectional view of an anode stripe region of the anode plate in accordance with a fourth embodiment of the present invention.

Still other variations are considered to be within the scope of this invention. As shown in FIG. 11, the stripe conductor 24 may take various forms; therefore, it may be a single stripe, illustratively 4$\mu$ wide and 1500 Å thick, down the center of the anode stripe 30. In addition, as shown in FIG. 12, the anode stripe 30 may not have a conductor 24 but rather be comprised of only phosphor particles 25 and conductive material 23 embedded into a transparent material 28.

Figure 13:
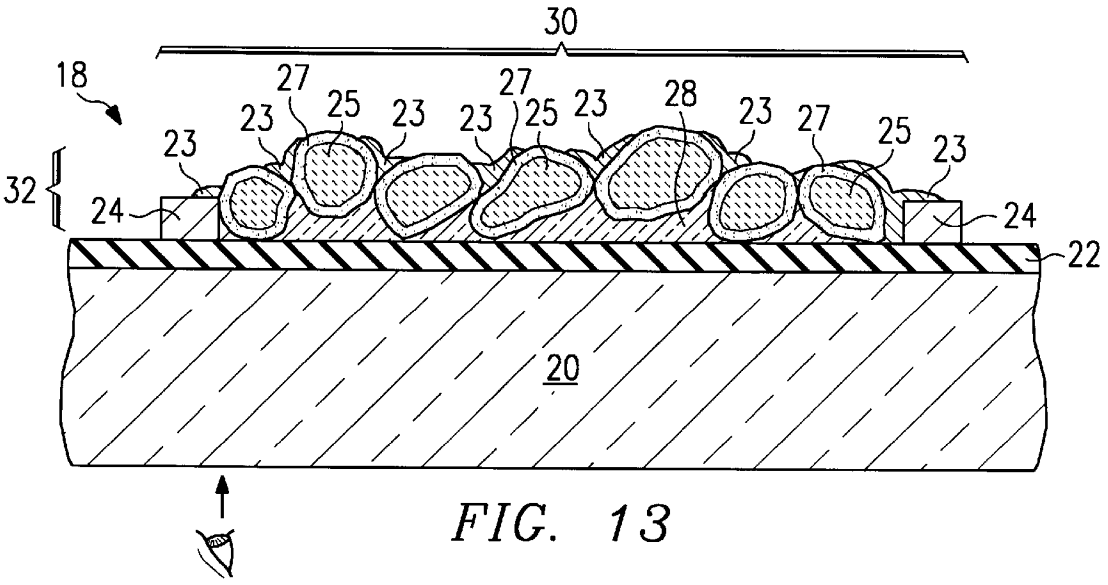
FIG. 13 is a cross-sectional view of an anode stripe region of the anode plate in accordance with a fifth embodiment of the present invention.

It is also within the scope of this invention to abrade the conductive layer 23 chemically such that the phosphor skins 27 remain intact. An example of the resulting structure is shown in FIG. 13.

Finally, while the disclosure describes the use of the sputtering and ion milling techniques to remove the phosphor coating 27 and portions of conductive material 23, alternative physical or chemical processes may be used. For example, a Reactive Ion Etch (RIE) using halogens such as chlorine- or fluorine-based chemistries would also remove portions of conductive material 23 and coating 27 through a chemical process. This alternative may be desirable because the process could be accomplished at lower voltages and therefore would be less likely to cause any damage the phosphor particles.

The methods disclosed herein for embedding phosphors into a transparent material, applying the conductive material, and then removing portions of the conductive material and the inactive surface region of the phosphor particles overcome limitations and disadvantages of the prior art display devices and methods. Phosphor particles are generally nonconductive and therefor receive and store the charge created by the bombardment of the phosphor by the electrons emitted from the microtips. The resulting build-up of negative charge by the phosphor soon acts to repel subsequent incoming emitted electrons. This charge build-up lowers the phosphor's luminescent efficiency and thereby causes the display to dim. The addition of the conductive material 23 greatly increases the lateral conductive path between phosphor particles, thereby allowing the phosphor particles to dissipate their electrical charge easily. The advantageous result is that the phosphors can quickly receive newly emitted electrons. The electrons released by the phosphors into the conductive material do not re-enter surrounding phosphors because the electrons are more attracted to the conductive material in the spaces between the phosphors than to the generally non-conductive phosphors. In summary the improved dissipation of charge results in a greatly enhanced luminescent efficiency.

Another advantage is that the light emitted from the phosphor particles are not impeded by the conductive ITO layer. The charge drains from the phosphors laterally into the conductive material, yet the anode stripe conductors and the conductive material in between the phosphor particles do not block the light emitted by the phosphors from traveling to the viewer's eye. In addition, the layer of conductive material lying between the phosphor particles acts as a back reflection surface to redirect to the viewer's eye the photons which are deflected off the of SOG/glass interface.

Removing the conductive material and the inactive surface region of the phosphors at the surface of the arrangement will allow more electrons emitted from the microtips of the cathode plate to penetrate to the active region of the phosphor particles; thereby transferring more energy to excite luminescence. Thus, removal of the conductive material and the particle surface will reduce the loss of incident electrons in the conductive material and the inactive surface region of the phosphor particle which causes a reduced luminescence efficiency.

The result of the manufacturing process described above is a higher efficiency FED display than prior art displays at a low operating voltage. Furthermore, by reducing the operating voltage required to realize the desired luminance level, less power is consumed. Since the advantageously described processes for embedding the phosphors into a transparent material, depositing the conductive material between the phosphor particles, and removing selected conductive material and phosphor surfaces are well understood, all of the above advantages are realized without the time and expense of developing a new technology.

While the principles of the present invention have been demonstrated with particular regard to the structures and methods disclosed herein, it will be recognized that various departures may be undertaken in the practice of the invention. The scope of the invention is not intended to be limited to the particular structures and methods disclosed herein, but should instead be gauged by the breadth of the claims which follow.

What is claimed is:

1. A method of fabricating an anode plate for use in a field emission display device, said method comprising the steps of:

providing a transparent substrate;

forming electrically conductive regions on a surface of said substrate;

applying transparent insulative material over said substrate;

partially embedding particles of luminescent material in selective areas of said transparent insulative material;

removing said transparent insulative material from over said electrically conductive regions;

applying a layer of electrically conductive material over said luminescent material and said electrically conductive regions; and abrading said layer of electrically conductive material so as to remove portions of said layer of electrically conductive material and portions of at least some of said luminescent particles.

2. The method in accordance with claim 1 wherein said step of embedding particles of luminescent material onto said transparent insulative material comprises depositing said luminescent material on said transparent insulative material by dusting.

3. The method in accordance with claim 1 wherein said electrically conductive regions are formed as parallel stripes.

4. The method in accordance with claim 1 wherein said step of abrading said layer of electrically conductive material so as to remove portions of said layer of electrically conductive material and portions of at least some of said luminescent particles comprises sputtering.

5. The method in accordance with claim 1 wherein said step of abrading said layer of electrically conductive material so as to remove portions of said layer of electrically conductive material and portions of at least some of said luminescent particles comprises ion milling using an ionized inert gas.

6. The method in accordance with claim 1 wherein said step of abrading said layer of electrically conductive material so as to remove portions of said layer of electrically conductive material and portions of at least some of said luminescent particles comprises etching.

7. The method in accordance with claim 6 wherein said etching step includes at least one of plasma etching, or reactive ion etching.

8. The method in accordance with claim 1 wherein said luminescent particles are embedded in said transparent insulative material while said transparent insulative material is in a partially cured state.

9. The method in accordance with claim 8 further comprising the step, following said embedding step, of hard curing said transparent insulative material.

10. The method in accordance with claim 1 wherein said step of applying a layer of electrically conductive material on said luminescent particles includes evaporating aluminum.

11. The method in accordance with claim 1 wherein said step of applying a layer of electrically conductive material on said luminescent particles includes sputtering aluminum.

12. The method in accordance with claim 1 wherein said step of applying a layer of electrically conductive material on said luminescent particles includes chemical vapor deposition of tungsten.

13. The method in accordance with claim 1 wherein said transparent insulative material includes spin-on-glass.

14. A method of fabricating an anode plate for use in a field emission display device, said method comprising the steps of:

providing a transparent substrate;

applying transparent insulative material over said substrate;

partially embedding particles of luminescent material in selective areas of said transparent insulative material;

applying a layer of electrically conductive material over said luminescent material; and abrading said layer of electrically conductive material so as to remove portions of said layer of electrically conductive material and portions of at least some of said luminescent particles.

15. The method in accordance with claim 14 wherein said step of embedding particles of luminescent material onto said transparent insulative material comprises depositing said luminescent material on said transparent insulative material by dusting.

16. The method in accordance with claim 14 wherein said step of abrading said layer of electrically conductive material so as to remove portions of said layer of electrically conductive material and portions of at least some of said luminescent particles comprises sputtering.

17. The method in accordance with claim 14 wherein said step of abrading said layer of electrically conductive material so as to remove portions of said layer of electrically conductive material and portions of at least some of said luminescent particles comprises ion milling using an ionized inert gas.

18. The method in accordance with claim 14 wherein said step of abrading said layer of electrically conductive material so as to remove portions of said layer of electrically conductive material and portions of at least some of said luminescent particles comprises etching.

19. The method in accordance with claim 18 wherein said etching step includes at least one of plasma etching, or reactive ion etching.

20. The method in accordance with claim 14 wherein said luminescent particles are embedded in said transparent insulative material while said transparent insulative material is in a partially cured state.

21. The method in accordance with claim 20 further comprising the step, following said embedding step, of hard curing said transparent insulative material.

22. The method in accordance with claim 14 wherein said step of applying a layer of electrically conductive material on said luminescent particles includes evaporating aluminum.

23. The method in accordance with claim 14 wherein said step of applying a layer of electrically conductive material on said luminescent particles includes sputtering aluminum.

24. The method in accordance with claim 14 wherein said step of applying a layer of electrically conductive material on said luminescent particles includes chemical vapor deposition of tungsten.

25. The method in accordance with claim 14 wherein said transparent insulative material includes spin-on-glass.

26. A method of fabricating an anode plate for use in a field emission display device, said method comprising the steps of:

providing a transparent substrate;

forming electrically conductive regions on a surface of said substrate;

applying transparent insulative material over said substrate;

partially embedding particles of luminescent material in selective areas of said transparent insulative material;

removing said transparent insulative material from over said electrically conductive regions;

applying a layer of electrically conductive material over said luminescent material and said electrically conductive regions; and abrading said layer of electrically conductive material so as to remove portions of said layer of electrically conductive material.

27. The method in accordance with claim 26 wherein said step of embedding particles of luminescent material onto said transparent insulative material comprises depositing said luminescent material on said transparent insulative material by dusting.

28. The method in accordance with claim 26 wherein said electrically conductive regions are formed as parallel stripes.

29. The method in accordance with claim 26 wherein said step of abrading said layer of electrically conductive material so as to remove portions of said layer of electrically conductive material comprises sputtering.

30. The method in accordance with claim 26 wherein said step of abrading said layer of electrically conductive material so as to remove portions of said layer of electrically conductive material comprises ion milling using an ionized inert gas.

31. The method in accordance with claim 26 wherein said step of abrading said layer of electrically conductive material so as to remove portions of said layer of electrically conductive material comprises etching.

32. The method in accordance with claim 31 wherein said etching step includes at least one of plasma etching, or reactive ion etching.

33. The method in accordance with claim 26 wherein said luminescent particles are embedded in said transparent insulative material while said transparent insulative material is in a partially cured state.

34. The method in accordance with claim 33 further comprising the step, following said embedding step, of hard curing said transparent insulative material.

35. The method in accordance with claim 26 wherein said step of applying a layer of electrically conductive material on said luminescent particles includes evaporating aluminum.

36. The method in accordance with claim 26 wherein said step of applying a layer of electrically conductive material on said luminescent particles includes sputtering aluminum.

37. The method in accordance with claim 26 wherein said step of applying a layer of electrically conductive material on said luminescent particles includes chemical vapor deposition of tungsten.

38. The method in accordance with claim 26 wherein said transparent insulative material includes spin-on-glass.

* * * * *